United States Patent
Kulick et al.

[11] Patent Number: 5,594,237
[45] Date of Patent: Jan. 14, 1997

[54] PIN DETECTOR HAVING IMPROVED LINEAR RESPONSE

[75] Inventors: John D. Kulick, Pittstown; Eric S-F. Mak, Bellemeade, both of N.J.

[73] Assignee: The Whitaker Corporation, Wilmington, Del.

[21] Appl. No.: 393,753

[22] Filed: Feb. 24, 1995

[51] Int. Cl.$^6$ .................................................. H01L 27/14
[52] U.S. Cl. ...................................... 250/214.1; 257/458
[58] Field of Search ........................... 250/214.1, 214 R, 250/338.4; 257/431, 458, 459, 461

[56] References Cited

U.S. PATENT DOCUMENTS

| | | | |
|---|---|---|---|
| 4,035,907 | 7/1977 | Allen et al. | 29/590 |
| 4,859,616 | 8/1989 | Losehand et al. | 437/39 |
| 5,006,483 | 4/1991 | Ohtsuka et al. | 437/179 |
| 5,063,426 | 11/1991 | Chandrasekhar et al. | 257/458 |
| 5,079,596 | 1/1992 | Smith et al. | 357/15 |
| 5,112,774 | 5/1992 | Ohtsuka et al. | 437/175 |
| 5,145,809 | 9/1992 | Walker | 437/203 |
| 5,158,909 | 10/1992 | Ohtsuka et al. | 437/177 |
| 5,170,228 | 12/1992 | Sasaki | 257/458 |
| 5,177,758 | 1/1993 | Oka et al. | 372/50 |
| 5,221,638 | 6/1993 | Ohtsuka et al. | 437/175 |
| 5,252,142 | 10/1993 | Matsuyama et al. | 257/458 |
| 5,256,579 | 10/1993 | Lezec et al. | 437/22 |
| 5,270,252 | 12/1993 | Papanicolaou | 437/176 |
| 5,285,080 | 2/1994 | Abe et al. | 257/23 |
| 5,350,702 | 9/1994 | Kim | 437/40 |
| 5,386,137 | 1/1995 | Dell et al. | 257/458 |

FOREIGN PATENT DOCUMENTS

| | | | |
|---|---|---|---|
| 0557955 | 9/1993 | European Pat. Off. | H01L 31/105 |
| 0614233 | 9/1994 | European Pat. Off. | H01L 31/105 |

OTHER PUBLICATIONS

PCT International Search Report. International Application No. PCT/US96/01795. International Filing Date Aug. 2, 1996.

*Primary Examiner*—Edward P. Westin
*Assistant Examiner*—John R. Lee
*Attorney, Agent, or Firm*—William Francos

[57] ABSTRACT

A PIN detector for use in the communications industry having increased linearity and increased maximum optical power detection levels without distortion is disclosed herein. To this end, a PIN structure having a high carrier mobility quaternary material cap layer and a ternary photosensitive layer is disclosed that overcomes the limitations of low mobility devices as described above. The quaternary materials have much greater carrier mobility than InP material and thereby a much shorter carrier transit time across these layers. This reduced carrier transit time effect results in a much more linear response and accordingly greatly reduced intermodulation distortion.

11 Claims, 4 Drawing Sheets

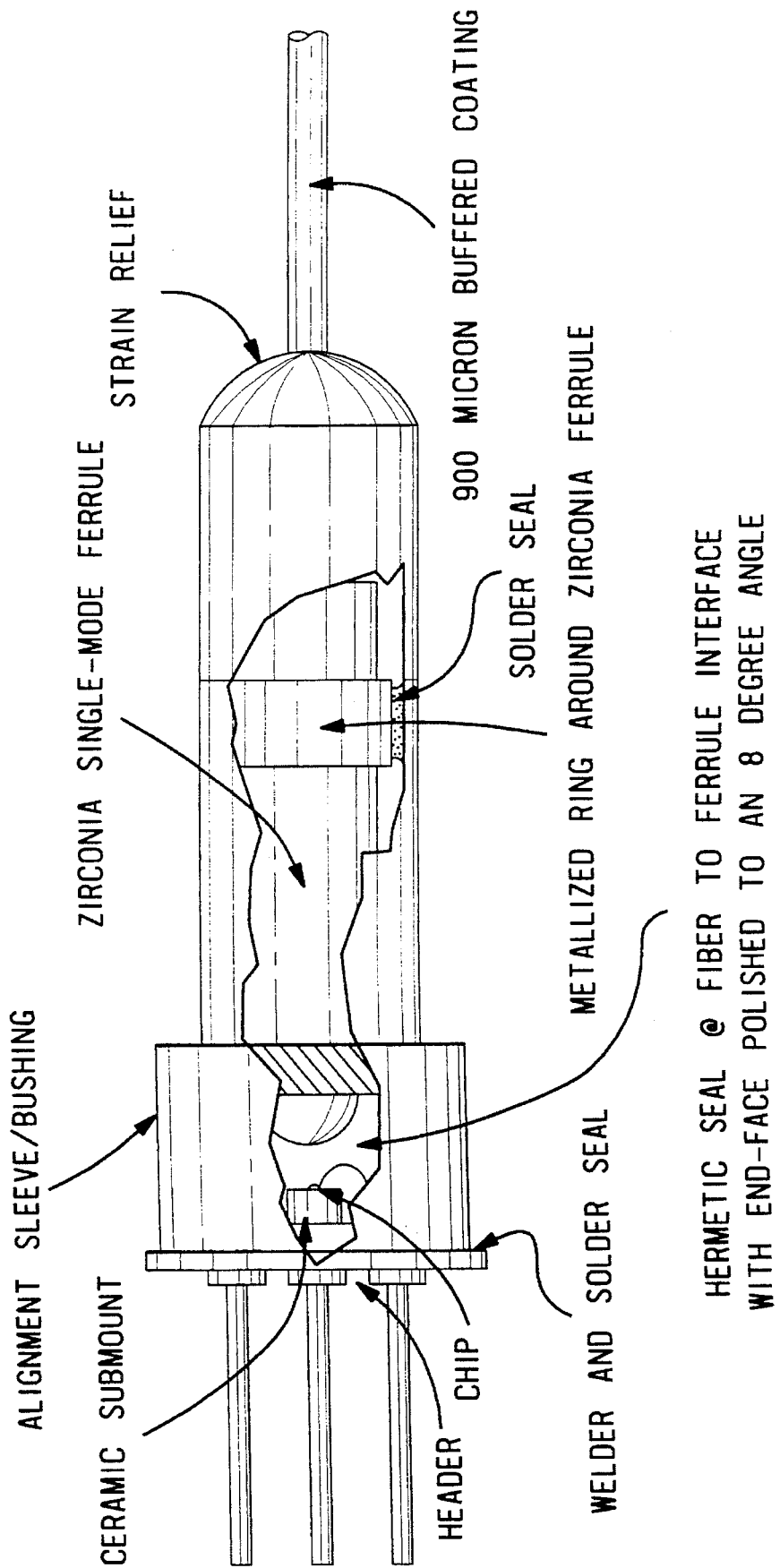

PIN DETECTOR HAVING IMPROVED LINEAR RESPONSE

FIELD OF THE INVENTION

The invention of the present disclosure relates to a PIN photodetector suitable for use in analog receiving applications, to include the CATV industry.

BACKGROUND AND SUMMARY OF THE INVENTION

The greater bandwidth and low transmission loss of optical fibers coupled with the capabilities of optical devices has led to the evolution of high data transmission in the telecommunications industry. In general, these systems have relied on FM subcarrier modulation to effect a digital-to-analog-to-digital conversion to effect the communication of digital signals. However, the large bandwidths required as well as the required conversion from analog to digital signals has restricted the use of these systems in many low cost requirement systems. One such industry that has required multicarrier communication is the CATV and other video distribution industries, which rely primarily on amplitude modulation vestigial side band (AM-VSB) signal transmission. These industries would benefit from a transmission and reception system that is highly linear and not reduced greatly in performance by ill effects of noise. To be sure, the CATV industry requires carrier-to-noise ratios on the order of nearly 50 dB, substantially greater than that required for FM systems. Furthermore, signal distortion across the entire system must have cumulative power on the order of magnitude of −50 dBc. While lasers have been developed to meet these requirements, it is essential that improvements be made in the entire system to effect the required signal transmission characteristics. The present invention is related to a low cost photodetector that supplies the requirements of linearity, low noise and low distortion needed for CATV fiber-to-the-home (FTTH) systems.

The basic performance of a PIN photodetector is described presently. Semiconductor pn junctions are employed widely for photodetection. The physics of their use in this application is as follows. Turning to FIG. 1, we see the energy band diagram of a pn junction used as a photodetector. Light absorbed at the p region of the junction, creating an electron-hole pair as shown. If the absorption of the light occurs at a point of the p-side that is within a diffusion length (the average length that a minority carrier will traverse before recombining with an opposite carrier) of the depletion region, the electron will in all probability reach the boundary layer and drift across the depletion layer. Such an electron will then contribute a charge e to the external circuit, thereby giving an electrical indication of the optical signal absorbed by the junction photodiode. Should the light be within the absorption band of the detector and be received on the n-side of the depletion region of the junction, another electron-hole pair will be created, and the hole will traverse to the junction again be diffusion, and then drift across the junction. Again, this will result in a charge flow e across the external load. Alternatively, and preferably, the photon could be absorbed in the depletion region, and the electron-hole pair created results therein. The electron and hole created will drift in opposite directions under the field of the bias potential. In this arrangement, each carrier will traverse a length that is less than the junction width and the contribution to the charge flow in an external circuit is e as determined from basic transport equations. This method is most desirable, since each absorption gives rise to a charge of magnitude e, and the delay in current response time due to finite diffusion time is avoided. From this observation comes the structure having a layer of intrinsic (i) semiconductor sandwiched between the p and n layer, thus the PIN diode. The intrinsic layer is a high resistivity layer and the potential drop of the bias potential is greatest across the intrinsic layer. Furthermore, the intrinsic layer is generally made large enough to assure that most incident photons are absorbed within this layer.

Turning to FIG. 2a, we see a cross sectional view of a conventional PIN photodetector. The intrinsic absorption layer consists of InGaAs ternary material which is epitaxially grown lattice matched on a semiconductor substrate. The substrate is generally chosen to be transparent in the wavelength range desired to be detected, and in the case of an InGaAs absorption layer, an $n^+$InP substrate is chosen as it is transparent in the range 1.3–1.55 microns in wavelength. Under operating conditions, the intrinsic layer is depleted fully by a top pn junction. The PIN structure can be achieved by simply growing a layer of $p^+$ InGaAs or InP over a layer of intrinsic InGaAs (not shown), but in most practical devices, fabrication is effected by having a localized $p^+$ region 201 formed by diffusion of a suitable dopant, for example Zn, into a layer of InP through a suitable mask, for example $SiN_x$ grown on the InP top layer. The desired effect of this practical technique of fabrication is a planar structure, with a well defined junction area (by virtue of the mask diffusion technique) and minimum surface current leakage by virtue of the buried junction. A PIN photodetector of this structure can be illuminated in the near infra-red either from the top through the pn junction or from the rear through the transparent InP substrate.

The device operates under the condition of reverse bias to effect the desired field direction to facilitate carrier flow upon absorption of light of the proper wavelength. The reverse bias potential of a few volts is usually enough to amply deplete the intrinsic layer of carriers, and in the absence of light signals, only a small reverse current flows across the boundaries. Finally, it is important to recognize that due the absence of a gain mechanism in the PIN diode, the gain-bandwidth product is nearly equal to the bandwidth itself, the bandwidth determined by the transit time of electron-hole pairs, and accordingly by the thickness of the intrinsic layer. Accordingly, the thickness of the intrinsic layer's effect on absorption efficiency must be balanced against its ill-effect on time of transit. In reality, the bandwidth of the PIN detector is limited by factors such as time constants of resistance and capacitance of the device, and bandwidths on the order of GHz are achievable.

The speed of response of a detector with low mobility in the contact layer will be highly position dependent. By position dependence it is meant the position of the incidence of the input radiation. For example, turning to FIG. 2b, we see the cross section of a PIN detector that has an asymmetric electrical contact 201 (as opposed to a symmetric annular contact) and a layer of InP, that exhibits low carrier mobility, in which is diffused a $p^+$ region. Radiation that is incident upon the photosensitive layer creates carriers that traverse the $p^+$ region to the contact 201 thereby effecting an electrical signal in the external circuit. Clearly photogenerated carriers that must traverse a large distance in low mobility material will take a substantially larger amount of time than carriers that must traverse only a short distance in the low mobility material. By comparison, for high mobility material, the difference in transit time in the dimensions of the device is negligible. Therefore, for detectors with a low mobility contact layer (such as the InP layer as shown in FIG. 2a), the speed of response of the detector will depend on the distance that a photogenerated carrier will have to travel to reach the contact metallization. For example, a carrier generated at point A of FIG. 2a will traverse to the contact in a much shorter time than one generated at point B. This effect is further exacerbated when the contact metallization is asymmetric to the region where the carriers are generated. In the extreme case where the contact metallization is restricted to a small partial circumferential region of this area, the positional dependence is extreme. (This is the case shown in FIG. 2a). Carriers generated in close proximity to the contact metallization have a short distance to travel and thus a fast speed of response. However, carriers generated in a position diametrically opposite to the contact metallization, have the longest distance to travel, and hence result in the longest response time. This positional dependence has been well documented by the applicants in measurements with InP cap layers and asymmetric contacts. The difference in the speed of response of the device, depending on the location of the photogenerated carriers results in undesirable distortion. The distortion results for example where two signals arrive at different times, that which arrives first may impinge the detector at a position farther than that which arrives later. Because of the traversal time lags, these signals could interfere, and thereby intermodulation distortion results. Another example is where the area of the incident signal is impingent on a relatively large area of the detector. The portion of the incident beam farthest from the contact metallization will generate carriers that are farther from those generated from the signal closer to the contact, and the signal is distorted. In the case of the low mobility InP contact layer even replacing the metallization contact with a contact that is symmetric to the region where the carriers are generated does not cure the problem (this configuration is shown in FIG. 2c). Because the InP material is one of low mobility inherently, there will always be a gradient in the performance across an InP contact layer device. For the usual dimensions encountered in PIN detector devices (50–100 microns is the usual width of the $p^+$ layer, and thereby the effective device width), this gradient always impacts the speed of performance. The net result is a portion of the device is found to be not subject to these problems (known as the "sweet-spot"), assumingly not subject to the disparity in carrier transport times.

With the advanced needs in the communications industry, there is an ever increasing need to have detectors that are highly linear in response over a great number of tones or individual modulation signals, in order to minimize distortion of the analog signal. Furthermore, there is needed a detector which is capable of performance at the relatively high power levels that are demanded of detectors in the CATV and other communications industries. Finally, there is a need for high volume manufacturing as the detectors are used greatly in large number applications such as fiber in the loop. There is therefore a need to have passively aligned devices in assembling a detector module, resulting in great accuracy at greatly reduced cost.

A PIN detector for use in the communications industry having increased linearity and increased maximum optical power detection levels without distortion is disclosed herein. To this end, a PIN structure having a high carrier mobility quaternary material cap layer and a ternary photosensitive layer is disclosed that overcomes the limitations of low mobility devices as described above. The quaternary materials have much greater carrier mobility than InP material and thereby a much shorter carrier transit time across these layers. This reduced carrier transit time effect results in a much more linear response and accordingly greatly reduced intermodulation distortion. Furthermore, having a cap layer of quaternary material allows for greater power level detection without distortion than for similar structures with InP material cap layers. This is due to the larger bandgap discontinuity between InP and InGaAs materials, than between suitable InGaAsP material and InGaAs. At high optical power illumination levels, where the number of photogenerated carriers are much higher than at lower power levels, even small bandgap discontinuities can result in reduced frequency response and saturation effects caused by "pileup" of electrical charge at the discontinuity.

OBJECTS, FEATURES AND ADVANTAGES OF THE INVENTION

It is an object of the present to have a PIN detector having a very linear and uniform detection characteristic over the full area of the photosensitive area.

It is a feature of the present invention to effect the desired uniformity and linearity of the detection characteristic by the use of a layer of high carrier mobility quaternary semiconductor material between the photosensitive layer and as the cap layer of the detector.

It is a feature of the present invention to have a reduction of the intrinsic capacitance of the device by reducing the area of the photosensitive region and thereby the layers of the device interfacing the photosensitive region. The reduction in capacitance is a direct result of the uniformity and linearity of response of the photosensitive layer.

It is an advantage of the instant invention to have the uniform and linear detection character PIN diode capable at operating at greater power levels and capable of detecting a great number of tones of optical signals.

It is an advantage of the present invention to have a detector with greater bandwidth capabilities by virtue of the reduction of the intrinsic capacitance of the device.

BRIEF DESCRIPTION OF THE DRAWINGS

FIG. 5 is a side and partial cut-away view of the receiver of the present invention in packaged form.

DETAILED DESCRIPTION OF THE PREFERRED EMBODIMENTS

Figure 3:
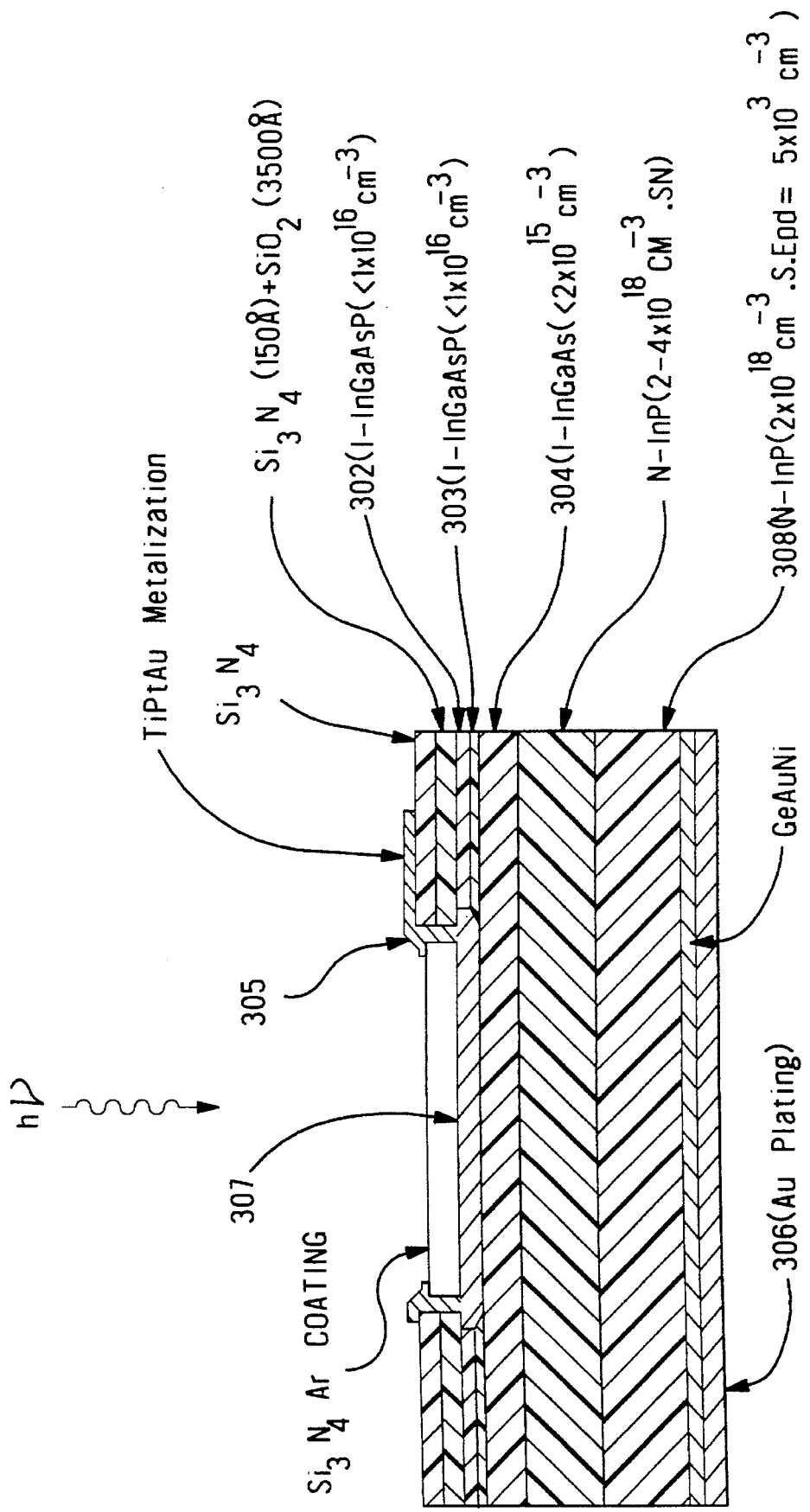
FIG. 3 is a cross sectional view of the PIN detector of the present invention having a ternary photosensitive intrinsic layer and intrinsic quaternary layers.

Turning to FIG. 3, we see the cross sectional view of the instant invention. The doping types and levels of dopants described herein are exemplary and are in no way intended to be limiting, but rather merely descriptive. Accordingly, variations of the dopant types and doping levels that are within the purview of the artisan of ordinary skill are considered within the purview of the present invention. The base substrate of n InP 308 is grown by standard LEC techniques having been doped to a level in the range of $2\times10^{18}$ cm$^{-3}$. Next a layer of n-doped (dopant level of approximately $2\times10^{18}$ cm$^{-3}$) InP is grown epitaxially preferably by standard liquid-phase-epitaxy (LPE) techniques, but also by metal-organic-vapor-phase-epitaxy (MOVPE). This n-type layer has grown thereon a layer of intrinsic (undoped) InGaAs, having been grown preferably by LPE, less preferably by MOVPE, and functions as the photosensitive layer of the detector. Thereafter a layer of $In_{1-x}Ga_x$-$As_yP_{1-y}$ is grown. This layer is chosen to be of a composition similar in bandgap energy to that of the InGaAs layer in order to minimize dissolution of the underlying InGaAs layer during growth. This layer is known as the anti-meltback layer to the artisan of ordinary skill. It is worthy to note that this layer can be omitted if using MOVPE as the growth technique. Thereafter, an additional layer of InGaAsP with a bandgap energy that is transparent to the wavelength of the incident signal, is grown readily on the $In_{1-x}Ga_xAs_yP_{1-y}$ layer. The $p_+$ region is formed by selective diffusion preferably of zinc through a patterned mask material such as $SiN_x$ as described before. The annular contact 305 is fabricated using standard photolithographic lift-off techniques and metal evaporation techniques, as are well known. The contact 306 is formed first by standard Ge-Ni-Au electron beam deposition techniques, followed by Au plating for suitable solder bonding.

The multi-quaternary structure enables the uniformity of the detection and reduces the intermodulation distortion. The physics of this phenomenon will be discussed presently. As discussed above, a multi-layer intrinsic semiconductor material comprising ternary and quaternary is used as the light accepting region of the PIN detector of the present invention in a manner as is described presently. In order to effect this, the bandgap of intrinsic materials is chosen to a wavelength maximum desired level in a manner described presently. In the instant case, the ternary layer is chosen to have a bandgap wavelength of approximately 1.65 microns. Accordingly, the detection of light of 1.55 microns is possible, as light of this wavelength is absorbed. So, when a signal is impingent on the photosensitive region, it is absorbed and an electron hole pair is created. The reverse bias voltage across the device creates an electrostatic field and the hole migrates to the n side and the electron to the p side of the junction. The electron traverses the quaternary layers, and due to the high mobility of the quaternary cap layer, the electrical response is nearly linear. This charge of course is then introduced into an external circuit, and the linear electric response is realized. When multiple tones or signals having different modulation frequencies are detected simultaneously, intermodulation distortion can result in structures that have the low mobility contact layer and/or asymmetric contact metallization about the region where the photogenerated carriers are generated, as described previously. As is shown in FIG. 3, the quaternary layers 302 and 303 have bandgaps corresponding to wavelengths of approximately 1.25 and 1.55 microns respectively. Thus, light of wavelength 1.3 microns is most strongly absorbed by the photosensitive layer 304 which has a bandgap corresponding to a wavelength of about 1.65 microns. Thus light impingent from the side of the annular contact 305 will be most strongly absorbed at the photosensitive layer. A bias voltage is applied across the device via the electrical contacts 306 and 305. Electron photocurrent traverses through layer 303 to the p-doped region 307 of layer 302 as described above, and holes traverse to the n doped InP 308, contributing to the electrical signal of the external circuit (not shown). The present invention can also utilize bandgap selection that will reduce the rf intermodulation distortion that is due to photogenerated carriers created from 1.3 micron light residually absorbed at the band edge. The carriers from this residual absorption then diffuse to the interface with the InGaAs layer and contribute to signal distortion. To eliminate the distortion due to these carriers, the bandgap of layer 302 is engineered to correspond to a wavelength of about 1.1 microns. This is done for the following reason. If light of 1.3 microns is impingent upon the detector, it is possible that some of the light is residually absorbed at the band edge of a layer having a band gap corresponding to 1.25 microns. In this event, there is diffusion current to the InGaAs interface and this will contribute to signal distortion. By choosing the bandgap of the cap layer 302 to be corresponding to 1.1 micron wavelength light, this issue will be greatly reduced if not eliminated, as absorption of the 1.3 micron light is eliminated.

Figure 1:
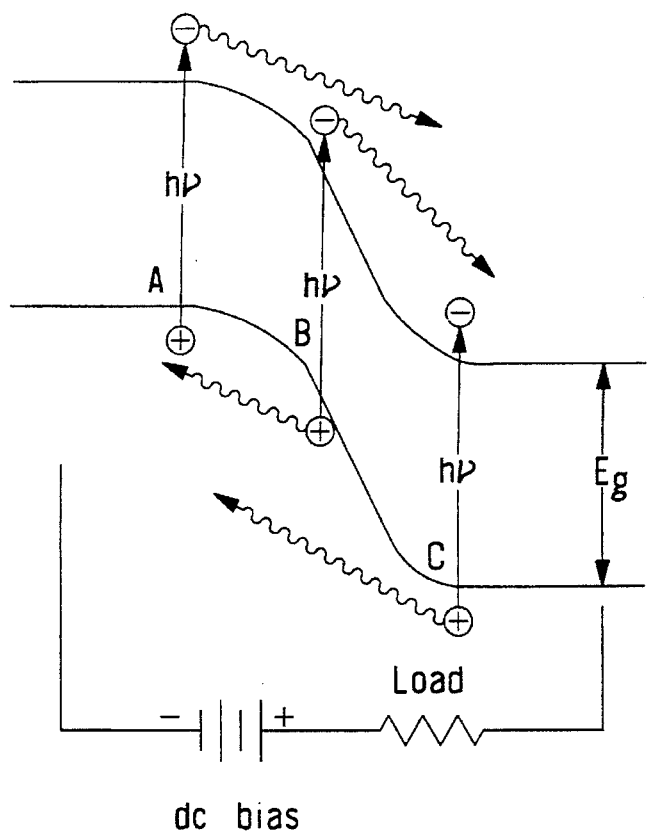
FIG. 1 is an energy band diagram of typical pn photodiode.
Figure 4:
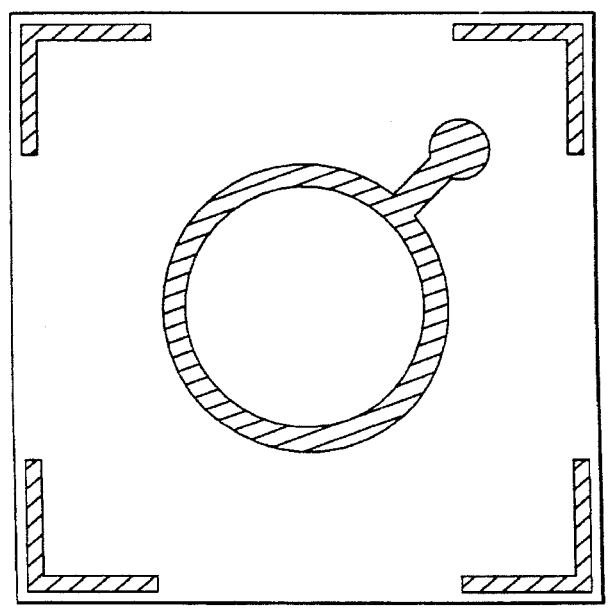
FIG. 4 is a top view of the detector showing the annular contact.
Figure 2A:
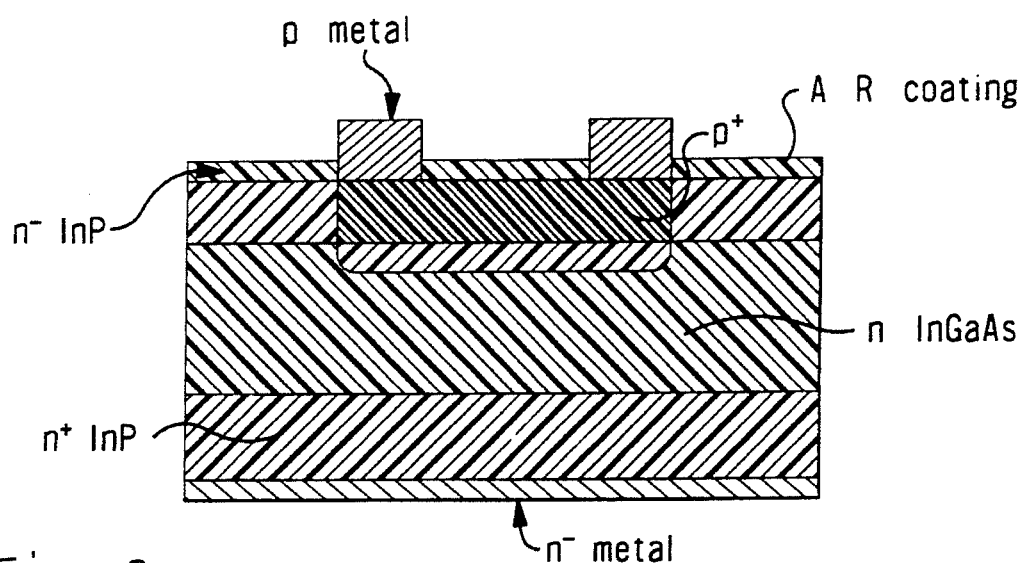
FIG. 2a is a cross-sectional view of a typical PIN detector having a buried p-doped layer formed by Zn diffusion.
Figure 2B:
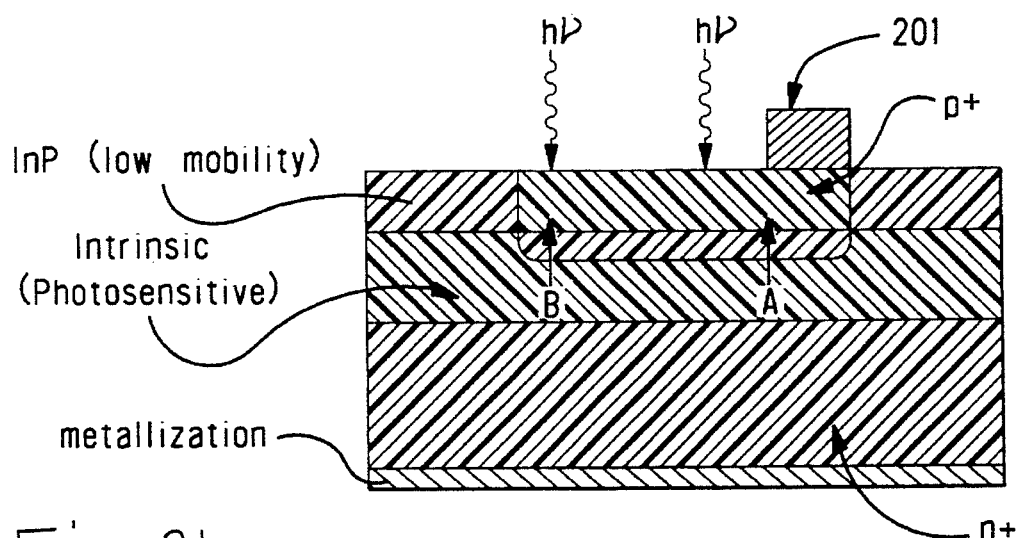
FIGS. 2b and 2c are cross-sectional views of PIN detectors having low mobility cap material and/or an assymetric metallization contact.
Figure 2C:
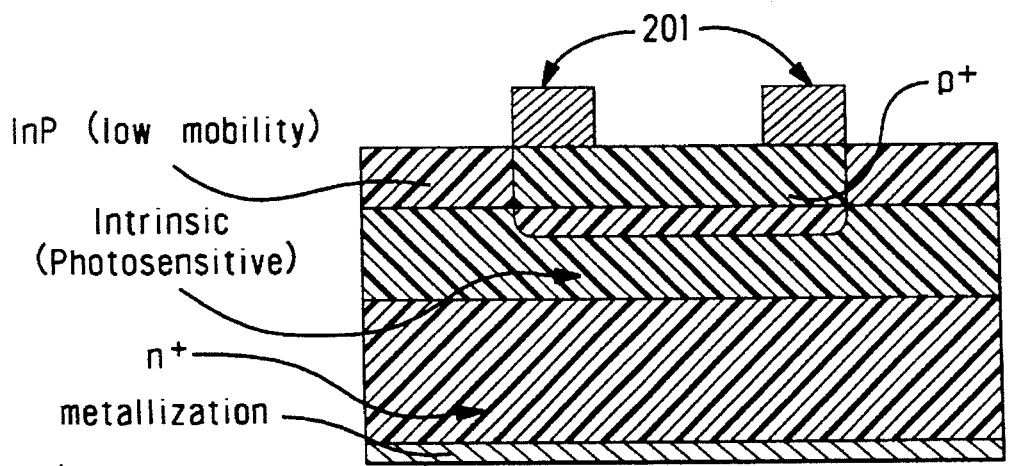

Additionally the uniformity and linearity of the device is effected by the annular contact 401, as seen in FIG. 4, as the contact enables a uniform electric field to be effected across the device. This contact in combination with the effects of the quaternary intrinsic layers results in a uniform detection area, and not the "sweet spots" found in other PIN detectors. By "sweet spot", a term of art, is meant the phenomena of a particular area of the detector which exhibits a more uniform rf output response and low intermodulation distortion (as described above) in a particular region of the detector area. This reduces the effective area of the device and also requires precise alignment to this area. In contrast, the detector of the present invention has nearly uniform response across substantially the full detector area, exhibiting two-tone distortion on the order of −80 dB. Accordingly, the need for alignment of the input optical with the photosensitive area is greatly reduced. To be clear, in conventional PIN photodetectors the "sweet spot" requires active alignment of the input optical signal (from an optical fiber or otherwise) with the "sweet spot." Due to the uniform response of the photosensitive area of the present invention, all of the area exhibits substantially uniform response to input light, and the maximization of response that is inherent in detectors with "sweet spots" is eliminated in the present invention. Additionally, the elimination of the "sweet spot" also eliminates the need for complicated rf measurements that must be performed during the active alignment of the fiber pigtail. Finally, it is important to note that the low heterojunction discontinuity between the layer of InGaAsP cap layer and the InGaAs photosensitive layer results in a structure that is more robust to saturation effects at higher input power levels (on the order of milliWatts).

Finally, a further feature of the instant structure is its reduction of intrinsic parasitic capacitance of the device. Parasitic capacitance reduces the effective bandwidth of the detector since transient signals reduce the effective switching capabilities of the device, and thereby the bandwidth. This reduction is accomplished by increasing the thickness of the InGaAs layer, while still maintaining full depletion, as well as reducing the parasitic capacitance by virtue of the uniform of response of the photosensitive area. This reduction of capacitance increases the operation speed and switching speed of the device. In the former technique capacitance reduction is achieved by low doping levels in the device and higher attainable bias voltage. In the latter technique, due to the response uniformity of the photosensitive area, the photosensitive area itself can be reduced greatly in magnitude, needing only to be compatible with the manufacturing tolerances needed for assembly (as opposed to larger photosensitive areas of low mobility material devices described above that rely on "sweet spots"). By reducing the area of the photosensitive region, and thereby the area of the layers of the device in communication therewith, parasitic capacitance can be reduced greatly.

The preferred embodiments having been described in detail, it will be appreciated that various changes and modifications can be made therein without departing from the theme and spirit of a very linear and uniform photodetector that is not susceptible to "sweet spots" and has a greatly reduced intrinsic capacitance. Such modifications are intended to be within the scope of the invention.

We claim:

1. A P-I-N photodetector, comprising:
   a.) a substrate of a selected doping type and level, having a bottom side, a top side and a selected thickness therebetween;
   b.) a first layer of doped semiconductor material grown on said top side of said substrate having the same doping type as said substrate;
   c.) a multi-layer of intrinsic semiconductor material deposited on said first layer of doped semiconductor material, one of said layers of said multi-layer intrinsic semiconductor material further comprising a cap layer of the photodetector and at least one layer of said multi-layer intrinsic semiconductor material functioning as the photosensitive region of the photodetector;
   d.) a second layer of semiconductor material selectively doped in type opposite said doping type of said first layer of semiconductor material and of a selected doping level disposed above said at least one layer of said multi-layer intrinsic semiconductor material that functions as the photosensitive region and said cap layer of said photodetector, and
   e.) an annular electrical contact disposed above and circumferentially about said second layer of semiconductor material, and an electrical contact disposed on said bottom surface of said substrate, whereby selected layers of said multi-layer intrinsic semiconductor material that function as the photosensitive region do so in a manner such that the photodetector response is highly uniform, linear and with low distortion across substantially all of the photosensitive region.

2. A P-I-N photodetector as recited in claim 1, wherein said first semiconductor layer is InP doped n-type.

3. A P-I-N photodetector as recited in claim 1, wherein said multi-layer intrinsic semiconductor material further comprises a layer of InGaAs, a layer of $In_{1-x}Ga_xAs_yP_{1-y}$ grown thereon and a layer of InGaAsP grown thereon, said layer of $In_{1-x}Ga_{As_y}P_{1-y}$ acting as an anti-meltback layer grown on said layer of InGaAs.

4. A P-I-N photodetector, comprising:
   a layer of semiconductor material having a first doping type, a multi-layer intrinsic semiconductor material disposed on said layer of semiconductor material having said first doping type, said multi-layer intrinsic semiconductor material having a ternary layer and at least one quaternary layer, and a selected region in said at least one quaternary layer selectively doped to have a second doping type opposite said first doping type.

5. A P-I-N photodetector as recited in claim 4, further comprising a first electrical contact connected to said layer of semiconductor material having a first doping type, and a second electrical contact connected to said selected region in said at least one quaternary layer, said second electrical contact being annular about said selected region.

6. A P-I-N photodetector, comprising:
   a layer of semiconductor material having a first doping type, a multi-layer intrinsic semiconductor material disposed on said layer of semiconductor material having said first doping type, said multi-layer intrinsic semiconductor material having a ternary layer, a lower quaternary layer and an upper quaternary layer, and a selected region in said upper quaternary layer selectively doped to have a second doping type opposite said first doping type.

7. A P-I-N photodetector as recited in claim 6, further comprising a first electrical contact connected to said layer of semiconductor material having a first doping type, and a second electrical contact connected to said selected region in said upper quaternary layer, said second electrical contact being annular about said selected region.

8. A P-I-N photodetector as recited in claim 6, wherein said ternary layer is InGaAs, said lower quaternary layer is $In_{1-x}Ga_xAs_yP_{1-y}$ and said upper quaternary layer is InGaAsP.

9. A P-I-N photodetector as recited in claim 6, wherein said first doping type is n-type and said second doping type is p-type.

10. A P-I-N photodetector, comprising:
    a layer of n-doped semiconductor material, a layer of intrinsic InGaAs disposed on top of said layer of n-doped semiconductor material, a layer of intrinsic $In_{1-x}Ga_xAs_yP_{1-y}$ disposed on top of said layer of InGaAs, a layer of InGaAsP disposed on top of said layer of $In_{1-x}Ga_xAs_yP_{1-y}$, and a selectively p-doped region of said layer of InGaAsP.

11. A P-I-N photodetector as recited in claim 10, further comprising a first electrical contact connected to layer of n-doped semiconductor material and a second electrical contact connected to said selectively p-doped region of said layer of InGaAsP, said second electrical contact being annular about said selectively p-doped region.

* * * * *